(12) United States Patent
Suh et al.

(10) Patent No.: US 7,626,859 B2
(45) Date of Patent: Dec. 1, 2009

(54) PHASE-CHANGE RANDOM ACCESS MEMORY AND PROGRAMMING METHOD

(75) Inventors: Dong-Seok Suh, Yongin-si (KR); Eun-Hong Lee, Yongin-si (KR); Jin-Seo Noh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 344 days.

(21) Appl. No.: 11/657,649

(22) Filed: Jan. 25, 2007

(65) Prior Publication Data

US 2007/0189065 A1 Aug. 16, 2007

(30) Foreign Application Priority Data

Feb. 16, 2006 (KR) .................. 10-2006-0015155
May 22, 2006 (KR) .................. 10-2006-0045815

(51) Int. Cl.
*G11C 11/00* (2006.01)
(52) U.S. Cl. .................. 365/163; 365/148; 365/100; 365/189.011

(58) Field of Classification Search .................. 365/46, 365/100, 148, 163; 257/2–5; 438/95, 96, 438/365, 482, 486, 597
See application file for complete search history.

(56) References Cited

U.S. PATENT DOCUMENTS

2005/0141261 A1* 6/2005 Ahn ........................ 365/148
2006/0157682 A1* 7/2006 Scheuerlein .................. 257/4

* cited by examiner

*Primary Examiner*—Son Dinh
*Assistant Examiner*—Harry W Byrne
(74) *Attorney, Agent, or Firm*—Harness, Dickey & Pierce, P.L.C.

(57) ABSTRACT

A programming method for a phase-change random access memory (PRAM) may be provided. The programming method may include determining an amorphous state of a chalcogenide material using programming pulses to form programming areas having threshold voltages corresponding to logic high and logic low, and/or controlling a trailing edge of programming pulses during programming to control a quenching speed of the chalcogenide material so as to adjust a threshold voltage of the chalcogenide material. Accordingly, programming pulses corresponding to logic low or logic high may have uniform magnitudes regardless of a corresponding logic level. Accordingly, reliability of a PRAM device may be improved.

13 Claims, 5 Drawing Sheets

PHASE-CHANGE RANDOM ACCESS MEMORY AND PROGRAMMING METHOD

PRIORITY STATEMENT

This application claims the benefit of priority to Korean Patent Application No. 10-2006-0015155, filed on Feb. 16, 2006 in the Korean Intellectual Property Office, and the benefit of priority to Korean Patent Application No. 10-2006-0045815, filed on May 22, 2006 in the Korean Intellectual Property Office, the entire contents of which are incorporated herein in their entirety by reference.

BACKGROUND

1. Field

Example embodiments relate to a phase-change random access memory (PRAM) and programming method for a phase-change random access memory (PRAM), and for example, to a phase-change random access memory (PRAM) and programming method for programming an amorphous state to control a threshold voltage of a PRAM.

2. Description of Related Art

Conventional phase-change random access memories (PRAMs) may use a resistance difference between amorphous and crystalline phases of chalcogenide. Conventional PRAMs may have disadvantages that a higher current may be required for a phase change and/or sizes of cells included in a PRAM may be larger.

Conventional PRAMs may be programmed using a threshold voltage difference without a phase change. Conventional PRAMs may be characterized in that an access transistor may not be required for each cell included in a PRAM due to self-rectification and/or a higher density design may be possible.

However, conventional PRAMs may implement programming through control of a pulse magnitude corresponding to a heating power of a chalcogenide material. For example, a magnitude of a programming pulse for programming a programming area (for example, an amorphous area) of the chalcogenide may be varied in magnitude or duration. Accordingly, achieving reliable programming may be problematic.

SUMMARY

Example embodiments may provide a programming method for improving reliability of information recording in a PRAM through a more effective control of a threshold voltage.

According to an example embodiment, a programming method for a phase-change random access memory (PRAM), may include determining an amorphous state of a chalcogenide material using programming pulses to form programming areas having threshold voltages corresponding to logic high and logic low, and/or controlling a trailing edge of programming pulses during programming to control a quenching speed of the chalcogenide material so as to adjust a threshold voltage of the chalcogenide material.

According to an example embodiment, a programming method for a phase-change random access memory (PRAM), may include determining an amorphous state of a chalcogenide material using programming pulses to form programming areas having threshold voltages corresponding to logic high and logic low, and/or controlling a trailing edge of the programming pulses to control a quenching speed of the chalcogenide material so as to adjust a threshold voltage of the chalcogenide material.

According to an example embodiment, controlling a trailing edge of programming pulses may be temporary.

According to an example embodiment, a phase-change random access memory (PRAM) may include an upper electrode, a lower electrode, and/or a chalcogenide layer between the upper electrode and the lower electrode. Programming pulses may be used to form programming areas having threshold voltages corresponding to logic high and logic low to determine an amorphous state of the chalcogenide layer.

According to an example embodiment, a memory array may include a plurality of the phase-change random access memories and/or a plurality of word lines intersecting a plurality of bit lines. The phase-change random access memories (PRAM) may be arrayed around intersections between the plurality of word lines and the plurality of bit lines.

According to an example embodiment, the programming pulses may have a melting portion and/or a quenching portion. A magnitude of the melting portion may have no variation between programming pulses, and/or the quenching portion may be varied using program information to control the quenching of the chalcogenide material melted during the melting portion so as to control threshold voltages of programming areas of the chalcogenide material.

According to an example embodiment, if the quenching portion is longer, e.g., a quenching speed is slower, the threshold voltages of the programming areas may be higher. If the quenching portion is shorter, e.g., the quenching speed is faster, the threshold voltages of the programming areas may be lower.

According to an example embodiment, a width of a quenching portion of programming pulses corresponding to first bit data, for example, logic low information "0" may be 20 ns or less. A width of a quenching portion of programming pulses corresponding to second bit data, for example, logic high information "1" may be 20 ns or more.

According to an example embodiment, the programming method may further include applying a reading pulse to the programming area having a lower threshold voltage so that a current flows the programming area having the lower threshold voltage.

According to an example embodiment, the programming method may further include applying a reading pulse to the programming area having the higher threshold voltage so that no current flows in the programming area having the higher threshold voltage.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
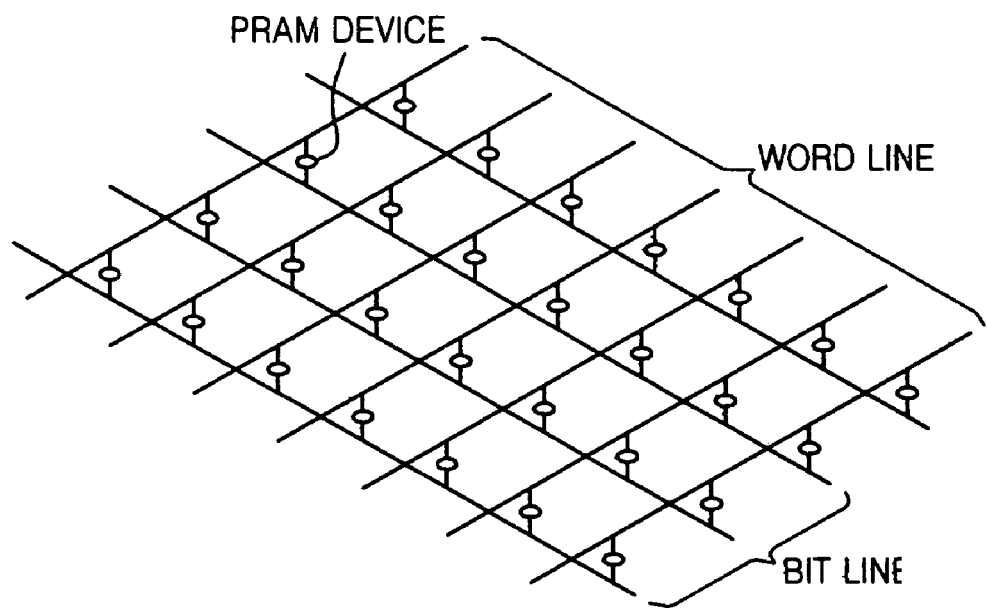
FIG. 1 is a schematic view illustrating an array of phase-change random access memory (PRAM) devices adopting a programming method according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a schematic view illustrating an array of phase-change random access memory (PRAM) devices implementing a programming method according to an example embodiment. Referring to FIG. 1, a plurality of word lines and/or a plurality of bit lines may be arrayed on an X-Y matrix, and/or PRAM devices may be arrayed around intersections between the plurality of word lines and/or the plurality of bit lines.

Cells in which the PRAM devices may be arrayed may selectively store logic low or logic high due to electric characteristics of the PRAM devices which need not have a selection switch. Logic low "0" and logic high "1" may be stored as differences between two threshold voltages Vth-H and Vth-L. A selection of the lower and higher voltages Vth-L and Vth-H may depend on the programming method of an example embodiment.

Figure 2:
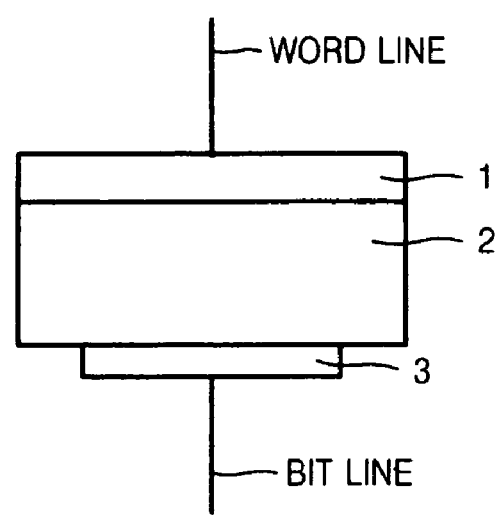
FIG. 2 is a schematic cross-sectional view of a PRAM device implemented in the memory device shown in FIG. 1.

A PRAM device may include upper and/or lower electrodes 1 and/or 3 and/or a chalcogenide layer 2 as shown in an example embodiment in FIG. 2.

Figure 3A:
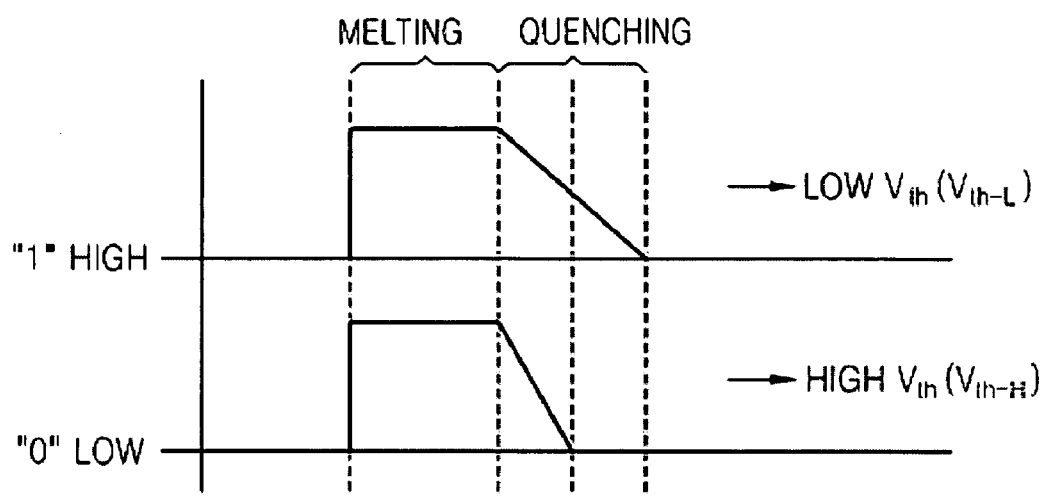
FIG. 3A is an example graph showing a pulse waveform illustrating a programming method according to an example embodiment.

FIG. 3A is an example graph showing a pulse waveform illustrating a programming method according to an example embodiment.

As shown in FIG. 3A, a melting portion and/or a quenching portion may exist in each programming pulse. The programming pulses may have the same magnitude regardless of the logic level (for example, logic low or logic high) of the corresponding bit of data. However, the quenching portion corresponding to a trailing edge of the programming pulses may have different durations for different logic levels, for example logic low and logic high. For example, for logic low the duration of the quenching portion may be shorter than for the logic high. For example, the higher threshold voltage Vth-H of the logic low data and the lower threshold voltage Vth-L of the logic high data may be set by a difference between quenching portions, e.g., a difference between quenching speeds. In example embodiments energies necessary for melting may be similar regardless of the logic level (for example, logic low or logic high) whereas a quenching portion may be varied corresponding to the logic level (for example, logic low or logic high). In an example embodiment, a variation in magnitude of programming pulses in a programming area may be removed, and a quenching portion of programming pulses may be controlled to adjust an amorphous state of each corresponding cell.

Figure 3B:
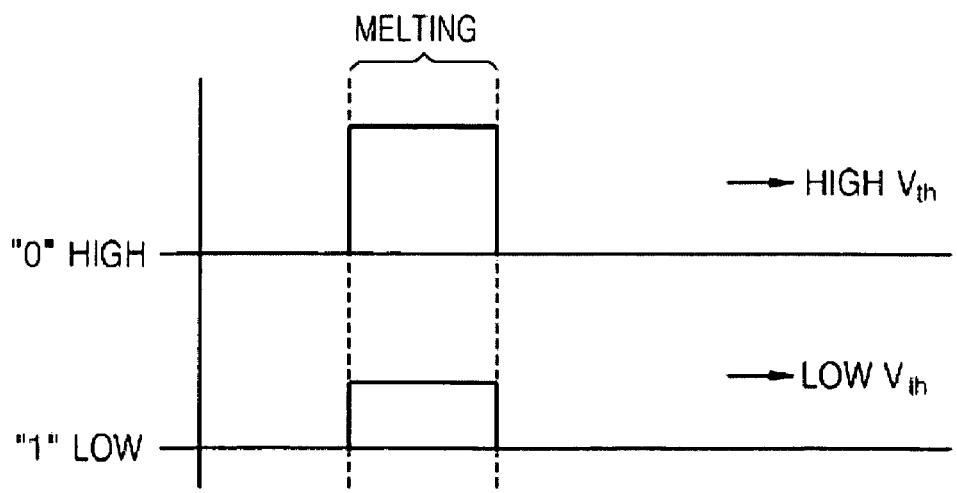
FIG. 3B is an example graph showing a pulse waveform illustrating a conventional programming method.

FIG. 3B is an example graph showing a pulse waveform illustrating a conventional programming method. As shown in FIG. 3B, programming pulses having the same duration and different magnitudes may be applied. A difference between the magnitude of programming pulses may cause a variation in a magnitude of programming pulses in a programming area, e.g., an amorphous area, and may reduce reliability of a PRAM device.

Figure 4:
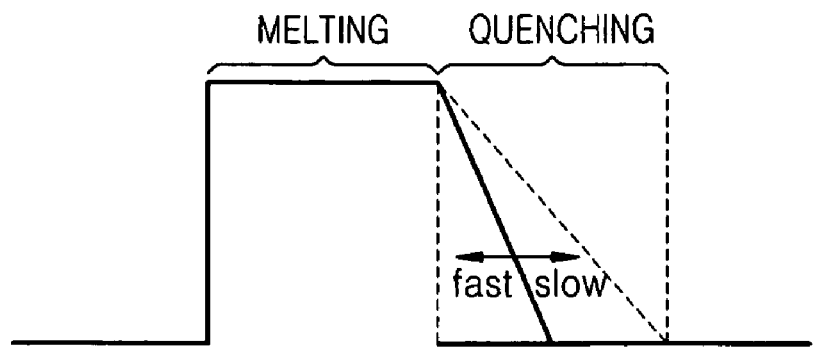
FIG. 4 is an example graph showing a waveform illustrating write pulses for storing logic low data and logic high data in a programming method of an example embodiment.

FIG. 4 is an example graph showing a waveform illustrating write pulses for storing logic low and logic high in a programming method according to an example embodiment. As described above, writing pulses for logic low and logic high may have melting portions having the same magnitude and/or duration to uniformly provide power necessary for melting. A duration of a trailing edge of the writing pulses may be different for logic low and logic high. As shown in FIG. 4, as the duration of the trailing edge is shortened, the quenching speed may become faster. As the duration of the trailing edge is lengthened, the quenching speed may become slower.

According to an example embodiment, a duration of a quenching portion of programming pulses forming a higher threshold voltage may be set to 20 ns or less, while a duration of a quenching portion of programming pulses forming a lower threshold voltage may be set to 20 ns or more.

Figure 5:
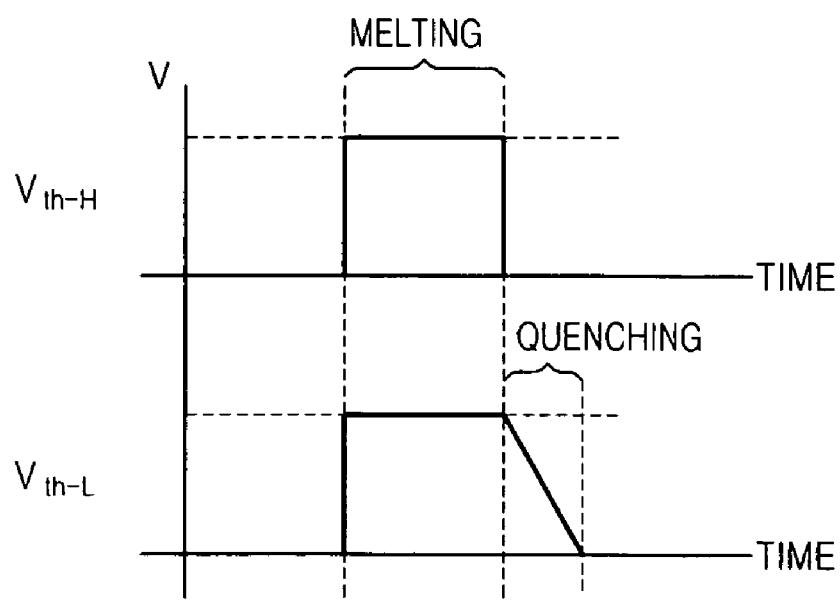
FIG. 5 is an example graph showing a pulse waveform illustrating a programming method according to an example embodiment.

FIG. 5 is an example graph showing a pulse waveform illustrating a programming method according to an example embodiment. According to an example embodiment, a quenching portion of programming pulses forming a higher threshold voltage may be "0." Accordingly, a falling edge may be formed at which a programming voltage may be removed instantaneously and immediately after a melting portion.

Figure 6:
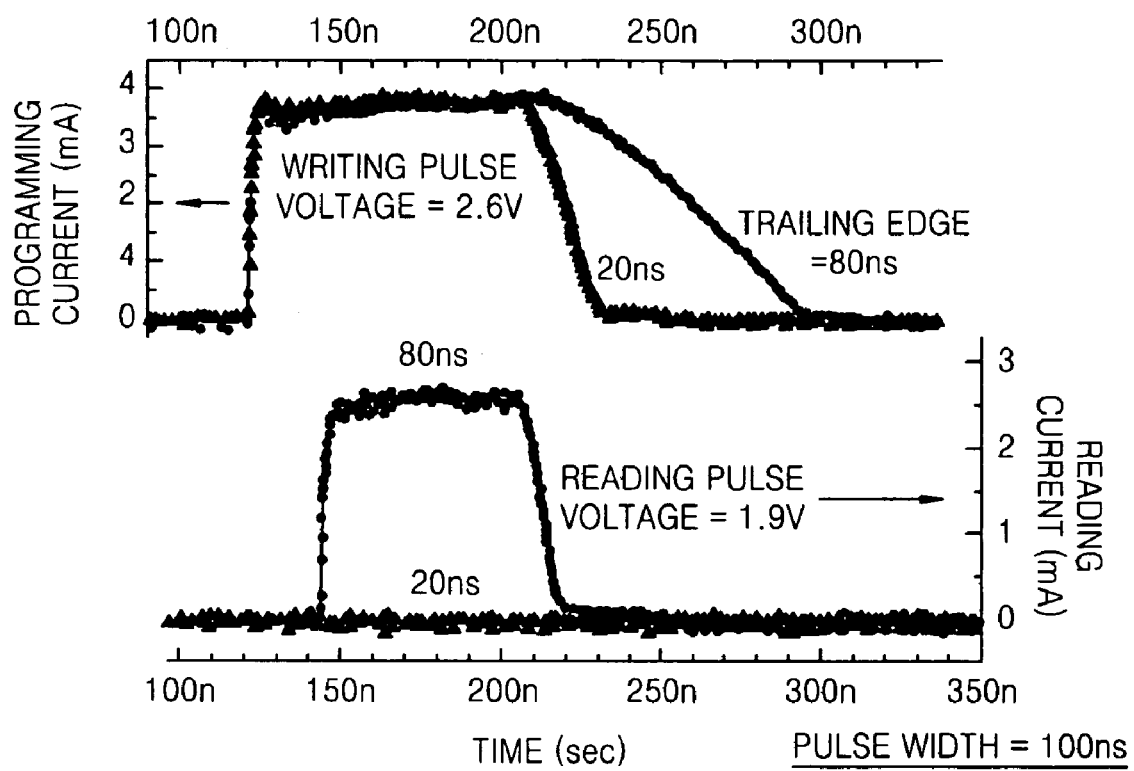
FIG. 6 is an example graph illustrating variations in a programming current and reading pulses in a programming method according to an example embodiment.

FIG. 6 is an example graph showing a pulse waveform illustrating a programming method according to an example embodiment, e.g., illustrating a relationship between a programming current and a reading current with respect to indium-doped $Ge_2Sb_2Te_5$. An upper line of the graph of FIG. 6 shows variations in a current during a programming, and a lower line of the graph shows variations in a current during a reading. A duration of a melting portion of write pulses may be 100 ns and/or a writing pulse voltage may be 2.6V during programming. Durations of trailing edges, corresponding to quenching portions, of the write pulse may be 20 ns and 80 ns for logic low and logic high, respectively. As shown in FIG. 6, a current of the melting portion of writing pulses may be about 3.5 mA and/or the current of the trailing edge may be linearly reduced from this value. A programming area having a higher threshold voltage Vth-H may be obtained due to higher speed quenching corresponding to the trailing edge having a duration of 20 ns. A programming area having a lower threshold voltage Vth-L may be obtained due to lower speed quenching corresponding to the trailing edge having the duration of 80 ns. Reading currents of the obtained programming areas will now be described. When reading pulses of 1.9V may be applied, a current of about 2.5 mA may flow in the programming area (for example, 80 ns) having the lower threshold voltage Vth-L. However, a current need not flow in the programming area (for example, 20 ns) having the higher threshold voltage Vth-H.

Figure 7:
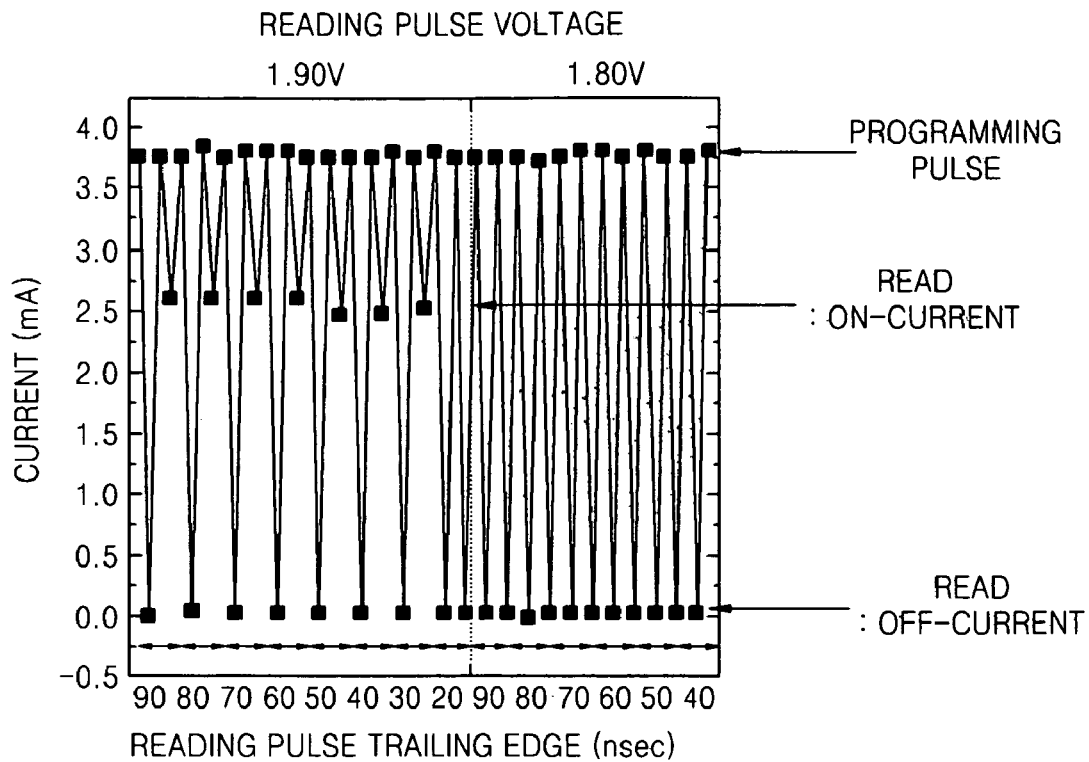
FIG. 7 is an example graph illustrating variations in a reading current caused by a difference in a reading voltage related to lower and higher threshold voltages in a programming method of an example embodiment.

FIG. 7 is an example graph illustrating variations in a reading current and reading pulses in a programming method according to an example embodiment. As shown in FIG. 7, a reading current varies with a reading pulse voltage of 1.9V but does not vary at 1.8V. For example, when a reading voltage has an desired or appropriate magnitude, for example, a magnitude of 1.9V, current may flow and/or a programming area may be deemed to be logic high.

Figure 8:
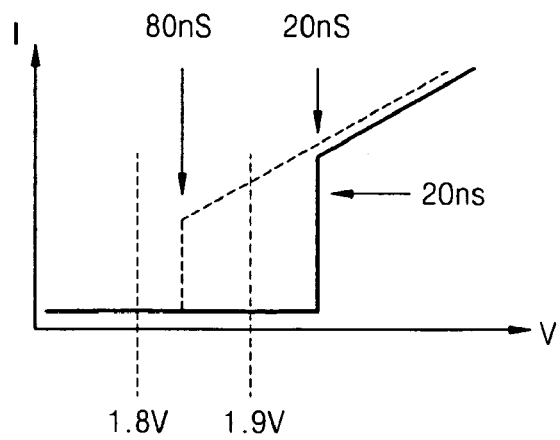
FIG. 8 is an example graph illustrating a relationship between lower and higher threshold voltages and a reading voltage according to an example embodiment.

FIG. 8 is an example graph illustrating variations in a reading current caused by a difference in a reading voltage related to lower and higher threshold voltages in a programming method of an example embodiment. As shown in FIG. 8, the reading voltage must be varied between higher and lower threshold voltages. For example, if the reading voltage is 1.8V, the reading voltage may have a lower value than the lower threshold voltage. Accordingly, current will not flow and/or a programming area may be deemed to be logic low.

As described above, according to an example embodiment, energies necessary for melting may be the same during recording logic low and logic high. Accordingly, magnitudes of programming pulses for programming areas may not be different regardless of programming logic low or logic high. An amorphous state of a chalcogenide material may be controlled by controlling a duration of a trailing edge of the programming pulses to program logic low or logic high.

In example embodiments, the chalcogenide layer 2 may be made of a transition metal oxide having multiple resistance states, as described above. For example, the chalcogenide layer may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The chalcogenide layer may be a chemical compound including one or more elements selected from the group consisting of S, Se, Te, As, Sb, Ge, Sn, In and Ag.

In some example embodiments, the chalcogenide layer may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the chalcogenide layer may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the chalcogenide layer may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the chalcogenide layer is described above as being formed primarily of ternary phase-change chalcogenide alloys, the chalcogenide alloy of the chalcogenide layer could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

Accordingly, a nonvolatile resistive memory having greatly improved reliability may be realized. Example embodiments may be applied to a memory device using such a nonvolatile resistive memory, for example, a chalcogenide material.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. A programming method for a phase-change random access memory (PRAM), comprising:
   determining an amorphous state of a chalcogenide material using programming pulses to form programming areas having threshold voltages corresponding to logic high and logic low; and controlling a trailing edge of the programming pulses to control a quenching speed of the chalcogenide material so as to adjust a threshold voltage of the chalcogenide material.

2. The programming method of claim 1, wherein controlling the trailing edge of programming pulses is temporary.

3. The programming method of claim 1, wherein the programming pulses have a melting portion and a quenching portion.

4. The programming method of claim 3, wherein the quenching portion is varied using program information to control the quenching of the chalcogenide material melted during the melting portion.

5. The programming method of claim 3, wherein a magnitude of the melting portion has no variation between programming pulses.

6. The programming method of claim 1, wherein a duration of the trailing edge of the programming pulses corresponding to the logic high is longer than a duration of the trailing edge of the programming pulses corresponding to the logic low.

7. The programming method of claim 4, wherein a duration of the quenching portion corresponding to the logic high is longer than a duration of the quenching portion corresponding to the logic low.

8. The programming method of claim 1, wherein a duration of the trailing edge of the programming pulses corresponding to the logic low is 20 ns or less, and a duration of the trailing edge of the programming pulses corresponding to the logic high is 20 ns or more.

9. The programming method of claim 4, wherein a duration of the quenching portion corresponding to the logic low is 20 ns or less, and a duration of the quenching portion corresponding to the logic high is 20 ns or more.

10. The programming method of claim 6, wherein a duration of the trailing edge of the programming pulses corresponding to the logic low is 20 ns or less, and a duration of the trailing edge of the programming pulses corresponding to the logic high is 20 ns or more.

11. The programming method of claim 7, wherein a duration of the quenching portion corresponding to the logic low is 20 ns or less, and a duration of the quenching portion corresponding to the logic high is 20 ns or more.

12. The programming method of claim 1, further comprising:
applying a reading pulse to the programming area having a lower threshold voltage so that a current flows the programming area having the lower threshold voltage.

13. The programming method of claim 1, further comprising:
applying a reading pulse to the programming area having the higher threshold voltage so that no current flows in the programming area having the higher threshold voltage.

* * * * *